(12) United States Patent
Turean

(10) Patent No.: US 10,331,570 B2
(45) Date of Patent: Jun. 25, 2019

(54) REAL TIME MEMORY ADDRESS TRANSLATION DEVICE

(71) Applicant: Avago Technologies International Sales Pte. Limited, Singapore (SG)

(72) Inventor: Flaviu Dorin Turean, Palo Alto, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 179 days.

(21) Appl. No.: 15/289,742

(22) Filed: Oct. 10, 2016

(65) Prior Publication Data

US 2018/0032442 A1 Feb. 1, 2018

Related U.S. Application Data

(60) Provisional application No. 62/369,139, filed on Jul. 31, 2016.

(51) Int. Cl.
  *G06F 12/10* (2016.01)
  *G06F 12/1009* (2016.01)
  *G11C 7/10* (2006.01)

(52) U.S. Cl.
  CPC ........ *G06F 12/1009* (2013.01); *G11C 7/1003* (2013.01); *G11C 7/1072* (2013.01); *G06F 2212/655* (2013.01)

(58) Field of Classification Search
  CPC .......... G06F 12/1009; G06F 2212/655; G11C 7/1003; G11C 7/1072
  See application file for complete search history.

(56) References Cited

U.S. PATENT DOCUMENTS

2014/0304566 A1* 10/2014 Henderson ............ G06F 1/3275
  714/764
2015/0199147 A1* 7/2015 Goldberg .............. G06F 3/0644
  711/170
2016/0139982 A1* 5/2016 Yu ...................... G11C 14/0018
  714/768

* cited by examiner

*Primary Examiner* — Reginald G Bragdon
*Assistant Examiner* — Edward Wang
(74) *Attorney, Agent, or Firm* — Sterne, Kessler, Goldstein & Fox P.L.L.C.

(57) ABSTRACT

A real time memory address translation device is described herein. The address translation device operates to change memory addresses from one address space that is used by system buses to another address space that is used by a main memory of the associated system. The translation device may be placed on the same chip as a corresponding processor core, for example, on a system on chip. The on-chip arrangement of the translation device enables predictable translation times to meet real-time requirement of time-sensitive subsystems.

20 Claims, 11 Drawing Sheets

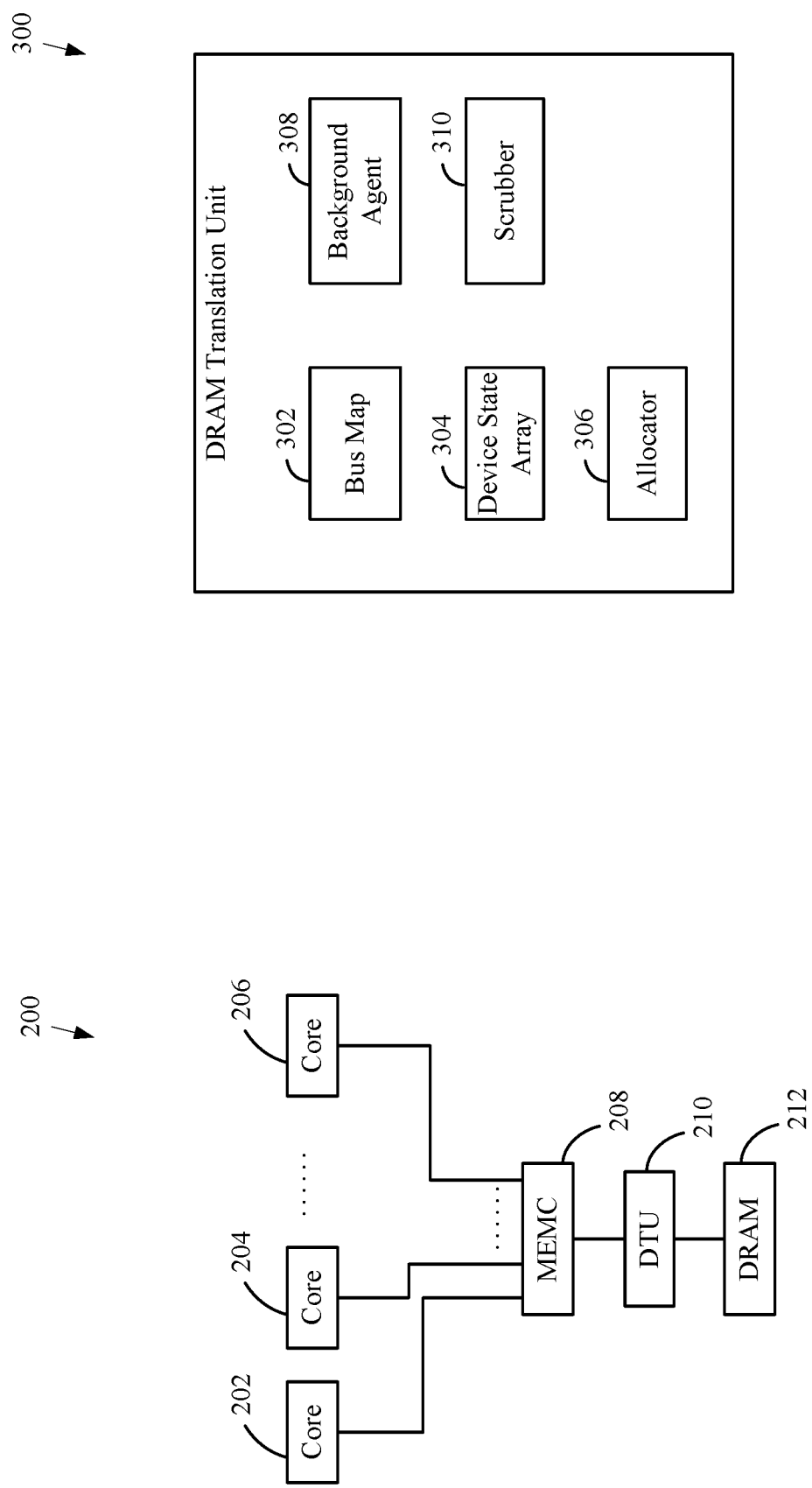

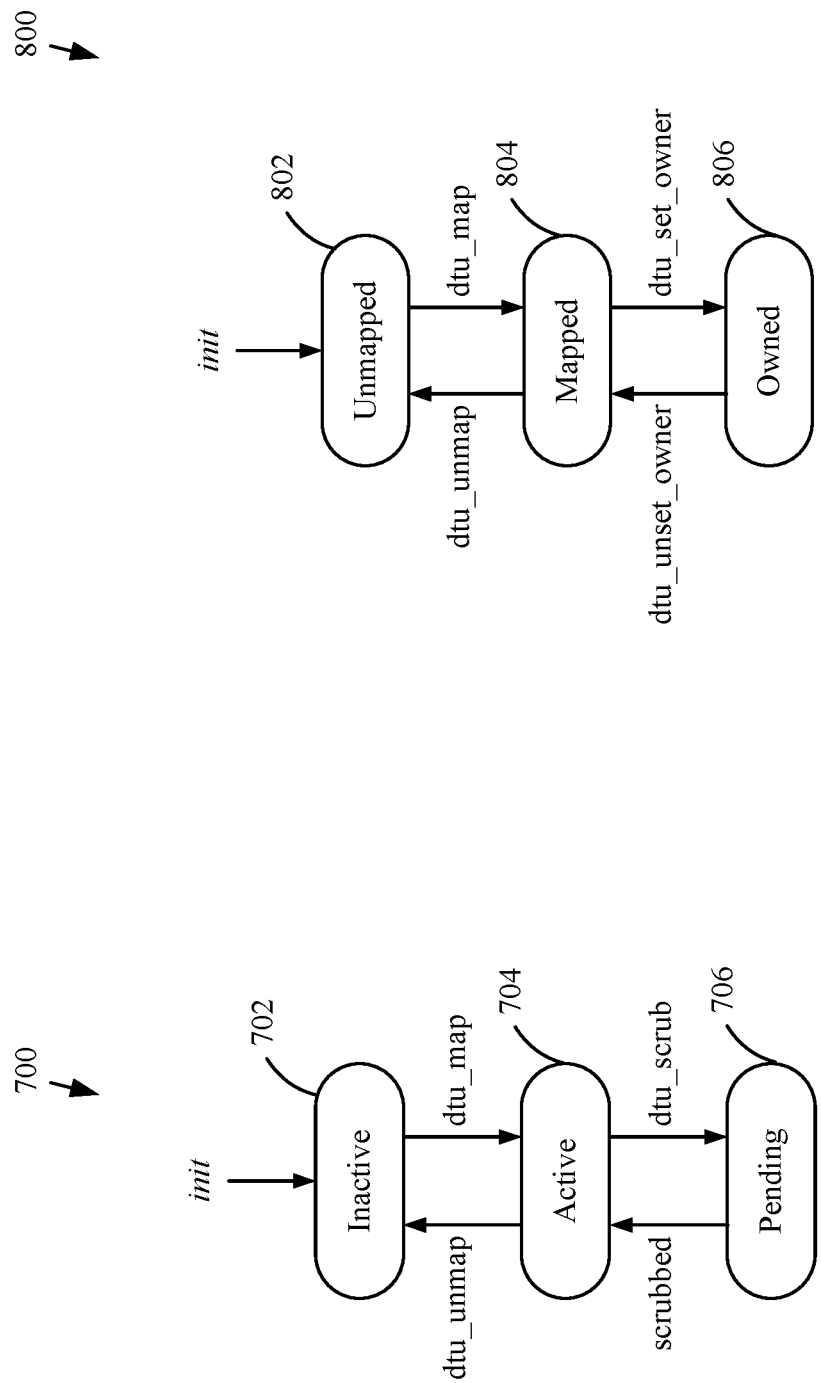

REAL TIME MEMORY ADDRESS TRANSLATION DEVICE

CROSS REFERENCE TO RELATED APPLICATION

This application claims priority to U.S. Provisional Patent Application No. 62/369,139, filed Jul. 31, 2016, entitled "Real Time Memory Address Translation Device," which is incorporated by reference herein in its entirety.

BACKGROUND

Technical Field

The subject matter described herein relates to a memory address translation device for converting from one address space to another address space in real time.

Description of Related Art

Most computing systems include a central processing unit (CPU) and an associated main memory that holds data and instructions from a program for processing by the CPU, usually for only as long as the program is in operation. Volatile memory is often used as the main memory because it is typically faster than non-volatile memory. Non-volatile memory can retain stored information without needing a constant supply of power. In contrast, volatile memory requires constant power to maintain stored information. Volatile memory has two forms, dynamic RAM (DRAM) and static RAM (SRAM). DRAM requires periodic refreshes such that stored information is periodically reread and rewritten for its content to be maintained. SRAM does not need to be refreshed as long as power is applied and only loses stored information when power is lost.

Main memory is typically connected to the CPU via a memory bus that includes an address bus and a data bus. The address bus is used by the CPU to send a memory address indicating a location of desired data. The data bus is used by the CPU to write and read data to and from memory cells. Conventionally, a memory management unit (MMU) managed by the operating system performs virtual memory management. All memory references are passed through the MMU, which translates virtual memory addresses to physical addresses. A virtual address space includes a range of virtual addresses that the operating system makes available to a program or process. A physical address space corresponds to memory addresses. The translation enables the data bus to access a particular storage cell of the main memory.

MMUs generally divide the virtual address space into pages of a certain size, for example, 4-64 kilobytes (KB). Most MMUs use page tables to map virtual page numbers to physical page numbers in the main memory. A page table contains one entry per page, and a cache of these entries are used to avoid accessing the main memory every time a virtual address is mapped. Such a cache is used to improve the speed of virtual address translation. If a requested address is present in the cache, a match can be determined quickly and the retrieved physical address can be used to access memory. However, if there is no match, the address translation process continues by looking up the page tables. This process can be time consuming because it involves reading contents of multiple memory locations to compute the needed physical address, which is then entered into the cache.

BRIEF SUMMARY

Methods, systems, and apparatuses are described for a real time memory address translation device, substantially as shown in and/or described in connection with at least one of the figures, as set forth more completely in the claims.

BRIEF DESCRIPTION OF THE DRAWINGS/FIGURES

The foregoing summary, as well as the following detailed description, is better understood when read in conjunction with the accompanying drawings. The accompanying drawings, which are incorporated herein and form a part of the specification, illustrate a plurality of embodiments and, together with the description, further serve to explain the principles involved and to enable a person skilled in the pertinent art(s) to make and use the disclosed technologies. However, embodiments are not limited to the specific implementations disclosed herein. The left-most digit(s) of a reference number identifies the number of the figure in which the reference number first appears.

FIG. 2 shows a block diagram of a computing system that includes a DRAM translation unit, according to an example embodiment.

FIG. 3 shows a block diagram of a DRAM translation unit, according to an example embodiment.

FIG. 7 shows a state diagram of a life cycle of a device page, according to an example embodiment.

FIG. 8 shows a state diagram of a life cycle of a bus page, according to an example embodiment.

Figure 1:
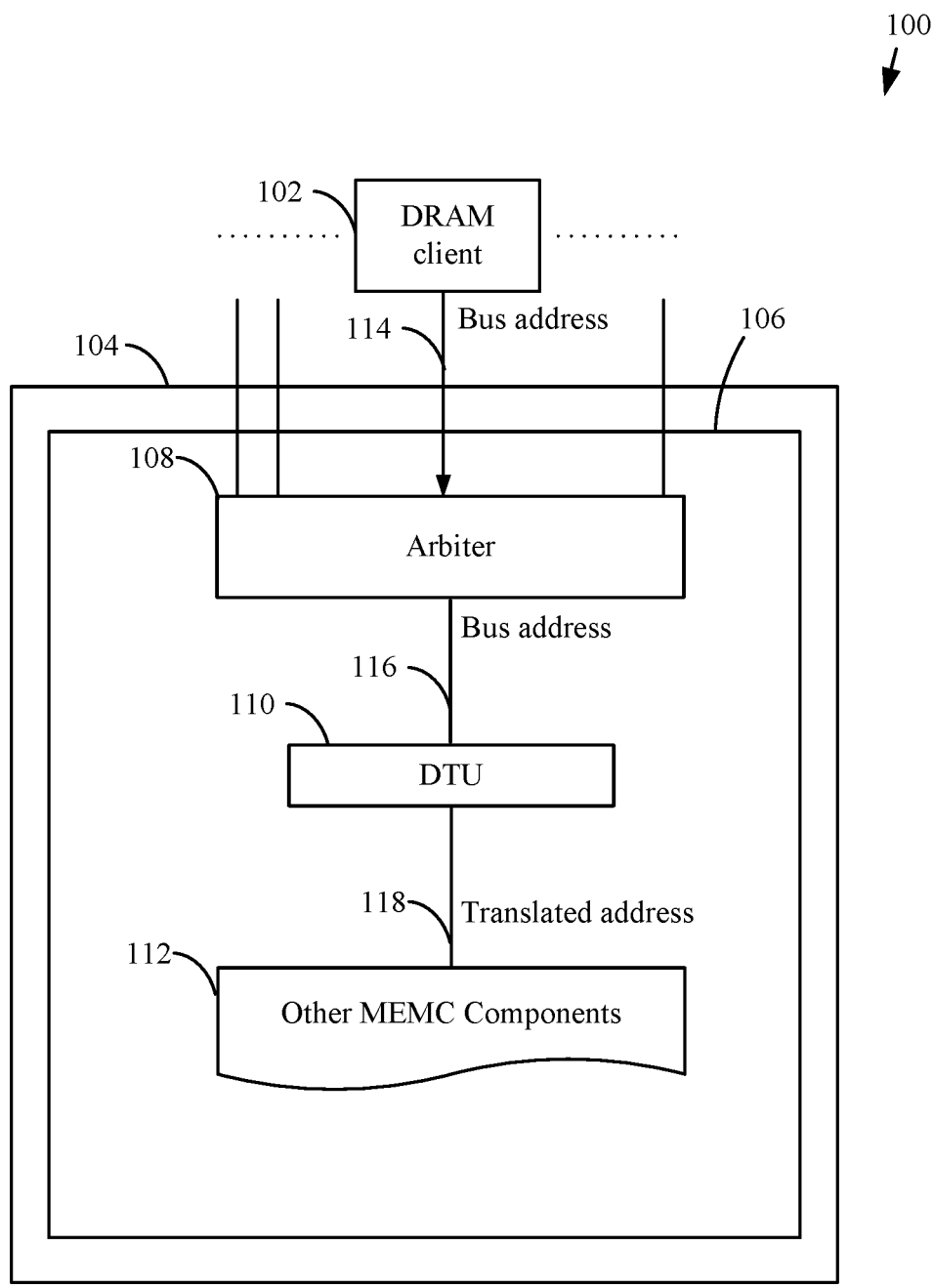
FIG. 1 is a block diagram of a MEMC (memory controller) that includes a DRAM translation unit, according to an example embodiment.

Exemplary embodiments will now be described with reference to the accompanying drawings.

DETAILED DESCRIPTION

Introduction

Reference will now be made to embodiments that incorporate features of the described and claimed subject matter, examples of which are illustrated in the accompanying drawings. While the technology will be described in conjunction with various embodiments, it will be understood that the embodiments are not intended to limit the present technology. The scope of the subject matter is not limited to the disclosed embodiment(s). On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection or through an indirect electrical connection via other devices and connections.

Embodiments of systems, devices and methods may be implemented in various architectures, each with various configurations. Several detailed features and embodiments are discussed below. Functionality may be referenced as logic, components, modules, circuits and the like. Functionality may be implemented in digital, analog or combined components. Functionality may be implemented in hardware, software or a combination thereof.

Example Embodiments

Most computing systems include main memory or primary storage in the form of DRAM, which is directly accessible to the CPU. The CPU reads instructions from the DRAM and executes them as required. A memory management unit (MMU) of the operating system (OS) manages usage of the DRAM, in particular mapping virtual memory locations referenced by processes/programs to actual physical memory locations of the DRAM.

Conventionally, a process or program requests the MMU to map from the virtual address space to the physical address space. However, the usage of memory is not always consistent for a process or subsystem of the computing system. For example, some classes of subsystems use large amounts of DRAM, but at various times use less than their maximum or may have exclusive-use with other subsystems. Examples of these classes include the video subsystem, graphics subsystem, and application subsystem.

The memory space allocated to a subsystem is referred to as the memory "footprint" of the subsystem. Because of the always changing memory space demands of processes/programs (e.g., DRAM footprint of 256 MB or larger, such as 512 MB), it may be desired for the MMU to trade memory space between subsystems, also referred to as footprint trading. However, there are difficulties with footprint trading between subsystems, including difficulties relating to: (1) latency, (2) fragmentation, (3) real-time responsiveness, and (4) secure video.

(1) Latency: Latency refers to undesired time delay in performing footprint trading. In the case of the graphics subsystem, graphics memory is usually longer-lived than the immediate action it serves. In addition to the deep pipelining of jobs from multiple subsystems or requestors, there is an overhead and latency of moving the footprint between the graphics subsystem and the OS. Adding the video subsystem as a third trade partner complicates issues even more.

(2) Fragmentation: Fragmentation refers to inefficient use of memory space due to non-contiguous storage of data. For example, the video subsystem is designed to work over contiguous address ranges, a property that is exploited for efficient physical DRAM access. The OS manages memory, typically in 4 KB units, and heavily fragments the footprint used by the OS, application and graphics, with some performance loss but with greater gains in application flexibility. The OS/App may pin pages at absolute address, preventing the return of the exact ranges as received from the video subsystem. Such pinning is inescapable, but it may be possible to construct and return to the video subsystem a different range of the same size. Problems will still exist as video-specific subsystems need to be notified of the new addresses. If an alternative range is returned because the original one was pinned or fragmented by the OS, then there is a risk of resource exhaustion, where eventually there will be no large-size ranges to be traded. From the perspective of the video subsystem, this is equivalent to running out of memory, thereby triggering an out-of-memory (OOM) type mechanism in the OS to create compacted ranges before the video subsystem can start again. There is a distinct possibility that the application being OOM-killed is the user interface through which the user requested the video playback. While techniques may be employed to create the illusion of contiguous ranges to the video subsystem(s), they still may not address two problems. The first problem relates to hardware cores that rely on the address to discover page/groupage membership, and an address translation will invalidate their preconditions. A second problem relates to hard real time processor cores that cannot afford the latency of translation misses. This can be addressed by an MMU that never misses where 4 KB pages and multiple multi-MB picture buffers from multiple cores are used. But, the size of such on-chip translation caches becomes prohibitive.

(3) Real-time Responsiveness: The video subsystem has real-time responsiveness requirements that are relatively strict compare to other subsystems. Vacuuming 224 MB of footprint takes time in the OS and the graphics driver, which impacts the responsiveness of the video-user interaction.

(4) Secure Video: When transferring footprint from the video subsystem to other system components, a mechanism for zeroing-out, scrubbing, etc., may be needed to prevent leaks of picture buffers into application space. If this is done by iterating over the bytes to be given away, there is a negative latency and bandwidth impact, and during that time the rest of the system performance degrades. This occurs with secure video. For example, when the OS gives away footprint to the graphics subsystem, zeroing out must also be performed to prevent kernel or sensitive user-space data from being exposed. Another approach is DRAM scrambling with a scrambling key when the transaction points to a secure video buffer.

Another issue with memory management relates to granularity of fragmentation. The prevalent page size in a modern CPU is 4 KB, which naturally becomes the dominant granularity for the OS and applications. With the advent of OS-managed peripherals (graphics cards, peripheral component interconnect (PCI) devices, etc.) and virtualizable input/output, 4 KB became the one size to fit them all. The OS or hypervisor in a multi-OS environment addresses the created fragmentation through the use of large tables of translations that increase quickly in size when dealing with gigabytes (GB) of address space.

The above difficulties with footprint trading and memory management may be mitigated with a real time memory address translation device described in example embodiments.

Example embodiments are directed to a real time memory address translation device also herein referred to as a DRAM translation unit (DTU) and related methods. The DTU maps bus addresses to device addresses to enable computing system subsystems to perform footprint trading. Though not required, the DTU may be placed on the same chip (e.g., silicon die) as the processor core, for example on a system on chip (SOC). This on-chip arrangement enables fixed translation time that meets the hard real time requirements of various subsystems (e.g., video, graphics, and application). This is possible, in part, because the DTU uses a large translation unit or page size for the translation, thereby overcoming the issue of large translation tables that are scattered far away from the processor core and in different memory areas. When the DTU is on the same chip as the processor core, the translation process may be carried out with greater efficiency and predictability than compared to a computing system that uses a traditional operating system managed MMU for address translation.

The DTU is not managed by the operating system, rather subsystems cooperatively work together to perform footprint trading that includes quickly yielding pages when done and acquiring pages as and when needed. The DTU may also include an application programming interface to request subsystems to yield pages.

In example embodiments, subsystems (e.g., via software agents or software device drivers) pre-declare their addressing needs and then install mappings to DRAM from those addresses. Thus, the DTU operates with fixed-size regions of DRAM, 2 MB for example, with subsystems checking them out and checking them back in as the need arises.

FIG. 1 is a block diagram of a computing system 100 that includes a DRAM translation unit, according to an embodiment. System 100 includes a DRAM client 102 that is in communication with a system on chip (SOC) 104. SOC 104 may include, among others, a memory controller (MEMC) 106. For simplicity sake, system 100 is depicted with only one DRAM client. However, system 100 may include multiple DRAM clients, and SOC 104 may include other components not shown, for example, one or more processor cores. MEMC 106 and its components are further described below.

MEMC 106 is configured to manage communications between a main memory and one or more processor cores or a CPU in system 100. MEMC 106 may be a circuit on SOC 104 as shown in FIG. 1. Alternatively, MEMC 106 may be implemented as a separate circuit. MEMC 106 may be placed on the same die as the one or more processor cores. In an example embodiment, MEMC 106 includes DRAM as the main memory and may be referred to as a DRAM controller. MEMC 106 includes logic necessary to read and write to the DRAM, and to maintain information in the DRAM by constantly refreshing the DRAM with rereads and rewrites. As shown in FIG. 1, MEMC 106 may include an arbiter 108, a DRAM translation unit (DTU) 110, and other components 112. Each of the components of MEMC 106 may be implemented as hardware (e.g., circuit, registers, etc.) or a combination of hardware with one or both of software and/or firmware. These components may operate independently or in a synchronous fashion with MEMC 106. For example, when MEMC 106 is inactive, DTU 110 may enter a low-power state.

Arbiter 108 is configured to control the flow of traffic between the requestors and shared memory using different arbitration schemes, such as round robin, first in first out, priority, or dynamic priority. Arbiter 108 is configured to receive a bus address 114 from DRAM client 102. Arbiter 108 comprises logic to determine which request, if multiple requests are received, to send to DTU 110 for translation. In the example embodiment of FIG. 1, arbiter 108 is configured to transmit bus address 116, originally received as bus address 114 from DRAM client 102, to DTU 110.

DTU 110 is configured to map/translate bus address 116 from a first address space to a second address space to generate translated address 118. DTU 110 may receive one or more control parameters (not shown in FIG. 1) to use in the translation process. Translated address 118 may be transmitted to other MEMC components 112 of MEMC 106 for further processing. For example, MEMC 106 may place translated address 118 on a bus or search for translated address 118 in the DRAM to obtain data at a location specified by translated address 118.

DTU 110 may be implemented at one or more locations. For example, FIG. 2 shows a block diagram of a computing system 200 that includes a centralized DTU, according to an example embodiment. The centralized DTU of FIG. 2 is an example embodiment of DTU 110 of FIG. 1. System 200 may include multiple processor cores 202, 204, and 206 as well as MEMC 208, DTU 210, and DRAM 212. System 200 may include more or fewer components than shown in FIG. 2. In FIG. 2, DTU 210 is depicted as a separate entity positioned between MEMC 208 and DRAM 212. However, in other embodiments, DTU 210 may be positioned elsewhere, such as within MEMC 208, adjacent to a processor core, or as part of another circuit or subsystem. Each component of system 200 may be implemented as hardware (e.g., integrated circuits) or a combination of hardware with one or more of software and/or firmware. The components of system 200 is further described as follows.

Processor cores 202, 204, and 206 are configured to execute software programs and processes. DTU 210 is an example of DTU 110 of FIG. 1, and is configured to translate addresses from an address space used by any of processor cores 202, 204, and 206 to the DRAM address space used by DRAM 212. MEMC 208 is configured to manage memory, by performing the signaling between the different components of system 200 to read and write data to and from DRAM 212. DRAM 212 is configured to store data in integrated circuits. In operation, a process executed by processor core 202, for example, may need data at a particular DRAM address. This address is translated by DTU 210 from an address space used by core 202 (e.g., a bus or a physical address space) to a DRAM address space used by DRAM 212. The address translated by DTU 210 is provided to MEMC 208, which uses the translated address to obtain information from DRAM 212. Information received from DRAM 212 may be passed back to processor core 202 by MEMC 208.

System 200 has a "translate at DRAM" configuration that avoids hardware replication of the DTU at each processor core, although DTUs may be implemented at each processor core for address translation. System 200 has advantages, including a single point of update, system consistency during translation, and ease of update analysis because the translate functionality is centralized. Moreover, in system 200, the latency of DTU 210, which may be a consistent or fixed parameter, is easier to calculate or take into consideration when determining system performance, and thus the impact with respect to DRAM transactions can be better taken into account.

In an embodiment, such as system 200 shown in FIG. 2, several address spaces may be used, which may optionally be defined as follows.

Virtual Address: A process running on top of an OS uses the virtual address space for addresses. Conventionally, an MMU checks and translates virtual addresses before the CPU forwards them, for example, on a bus to a memory.

Physical Address: The physical address space is what the CPU sends to the system.

Intermediate Physical Address (IPA): When virtual machines are running on a CPU, a virtual machine OS may think it is creating physical addresses but actually does not. Rather, the OS creates IPAs, and one more layers of MMU translation in the CPU translate the IPAs to "true" physical addresses that are sent to a bus.

Bus Address (BA): The BAs travel on system buses. A BA is what the process/software thinks will go to DRAM, but this is what gets shared between subsystems. This is the same as the physical address of the CPU, mentioned above.

Device Address or DRAM Address (DA): The DA is the address that gets placed on the DRAM channel. The DTU described herein applies a translation between the BA space and the DA space.

Not all DRAM accesses exist in all of the above address spaces, although some can. For example, for a user-space process running in a virtual machine on top of a CPU, an access from this process may traverse through all the address spaces: VA→IPA→PA=BA→DA. In contrast, in another example, a video decoder may receive buffer pointers from a video driver as PAs and put them on the bus untranslated. For example, a graphics core may receive a virtual address of a process inside a virtual machine and may translate it locally in its own MMU to a physical address. But, it is the responsibility of the graphics core driver to create the local MMU mapping from the virtual address to the physical address of the graphics core.

In example embodiments, it is desirable to have a DRAM with more addresses than bytes, and this can be achieved by modifying the global address map of a computing system. For example, assuming a DA range of 4 GB, a realizable capacity in each DRAM channel with DDR3/DDR4 technologies, this can be exposed to the on-chip clients as a BA range of 8 GB of address space. This creates an oversubscription factor of 2×. This factor increases if less DRAM is installed in the computing system. The oversubscription factor may be chosen based on cost and power implications or other specifications. When the channel is not fully populated, the oversubscription factor naturally increases. In example embodiments, the oversubscription factor of 2× is selected; however, other factors may be chosen as well, for example 3×, 4×. The oversubscription factor is enabled by an underutilization of physical memory.

DTU 110 shown in FIG. 1 and DTU 210 shown in FIG. 2 may be implemented in various manners. For example, FIG. 3 depicts a block diagram of a DRAM translation unit, DTU 300. DTU 300 of FIG. 3 is an example embodiment of DTU 110 of FIG. 1 or DTU 210 of FIG. 2. DTU 300 comprises a bus map 302, a device state array 304, an allocator 306, a background agent 308 and a scrubber 310. Each of these components may be implemented as hardware (e.g., registers, circuits, etc.) or a combination of hardware with one or both of software and/or firmware. For example, bus map 302 and device state array 304 may be stored in registers of a chip, such as SOC 104 shown in FIG. 1. The components of DTU 300 are further described below in conjunction with subsequent figures.

DTU 300 is configured to translate a bus address in a bus address super page to a device address in a device address super page. DTU 300 performs the translation within a predetermined period of time to meet hard real time requirements of DRAM requests having an upper-bound response time. A real time requirement demands that a task or process is completed in a predetermined amount of time (e.g., an upper-bound limit of 100 milliseconds) regardless of the conditions of a computing system. For a hard real time requirement, even occasional failures to meet this upper-bound completion time are fatal to the correctness of the system. In contrast, for a soft real time requirement, an occasional slip in completion time does not have correctness impact but may have measurable impacts on other systems or other design aspects.

Figure 4:
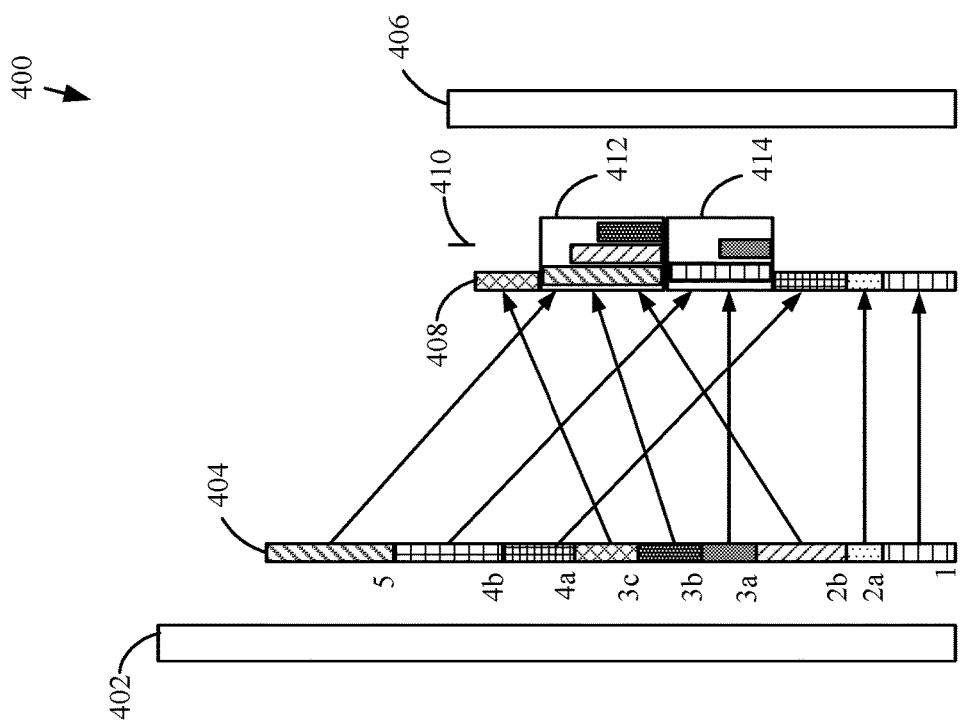
FIG. 4 shows a bar chart of mappings from bus items to DRAM components.

In operation, the memory controller associated with DTU 300 may expose in a global address map a bus address (BA) range that is larger or equal to the maximum-installable DRAM capacity, which is the device address (DA) range, such that the BA range may be mapped to the DA range. The BA range is also larger than the anticipated total of all footprint components to be placed in that DRAM. For example, FIG. 4 shows bar chart 400 that depicts the mappings of bus items to DRAM components in a computing system, such as computing systems 100 and 200 shown in FIGS. 1 and 2, respectively. Bar chart 400 includes bars 402, 404, 406, and 408. Bar 402 represents a bus address (BA) range that is part of a global address map used by one or more processor cores to reach a DRAM channel. Bar 404 represents a total bus address range used by 5 components of a computing system, 1-5, which may include operating systems, video drivers, or graphics cores, etc. Bar 404 shows the footprint of the five components being stacked on top of one another from 1 through 5 for illustrative purposes. Bar 406 represents a device address (DA) range that corresponds to the DRAM installed in the system associated with DTU 300. Bar 408 represents the tallied RAM footprint of components 1-5 with exclusivity sets. An exclusivity set is a grouping of components that have exclusive use of footprint with one another. The difference between bar 408 and bar 406 is indicated as slack 410.

As may be seen in FIG. 4, the total footprint requirement of components 1-5, shown as bar 404, exceeds the available DRAM represented by bar 406 because bar 404 is depicted as being higher than bar 406. Thus, it is not feasible to allocate the footprint required by components 1-5 shown as bar 404 given the installed DRAM. However, when the footprint demands of components 1-5 are further considered, improvements to memory allocation may be made. For example, a component may not need its entire footprint in one contiguous chunk or the entire footprint all the time. For instance, component 2 needs two separate address ranges (e.g., a base and an extension), 2a and 2b. Component 3 needs three address ranges, 3a, 3b, and 3c. Component 4 needs two address ranges, 4a and 4b. Components 1 and 5 each requires a single address range. Some of these components may have exclusive use of footprint with other components. These components may be grouped into exclusive-use groups 412 and 414 and the maximum size of each group may be recorded. Each of groups 412 and 14 may also be referred to as an exclusivity set. Once the exclusive-use groups have been determined, the DRAM footprint demands may be reconsidered and compared with the installed DRAM. If the exclusivity-set partitioning fails to fit, then a more aggressive exclusivity-set partitioning may be identified or individual footprint components may need to be sized down until a fit is obtained. If the exclusivity-set partitioning fits the available DRAM, as shown in FIG. 4 where bar 408 is shorter than bar 406 with left over DRAM space indicated as slack 410, then a feasible computing system may be realized. Thus, exclusive-use groupings 412 and 414 reduce the needed DRAM size. Accordingly, the components may assume ownership of bus addresses in a cooperative manner on a time-division access of the DRAM, regardless of whether or not there is a DRAM backing those bus addresses because of the oversubscription factor mentioned above.

Figure 5:
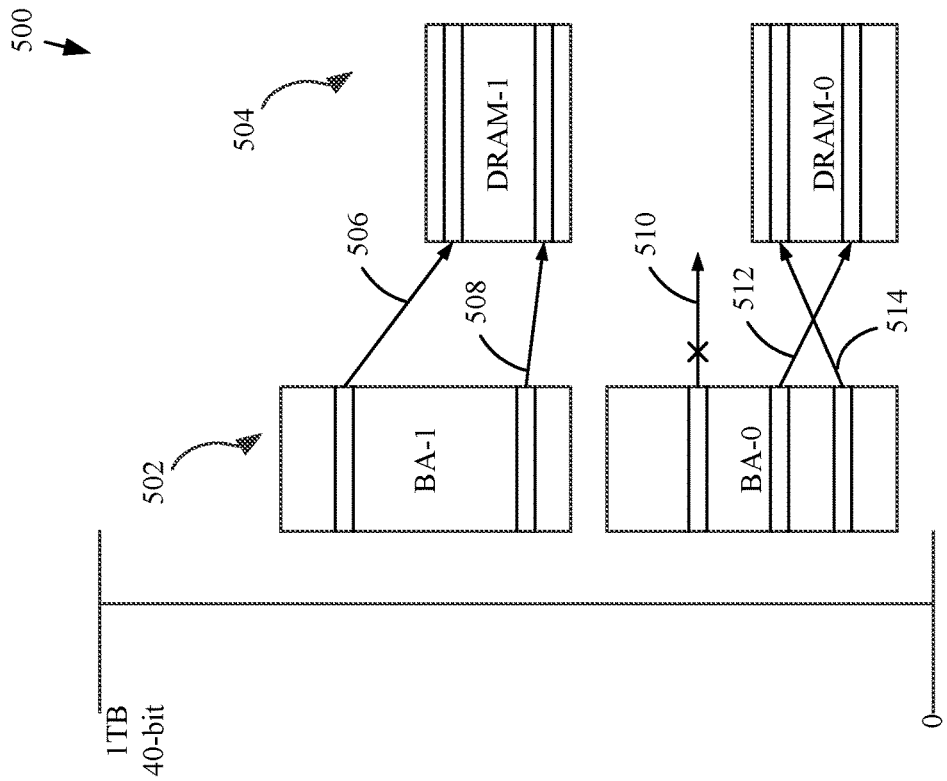
FIG. 5 is a diagram of mappings from a bus address space to a DRAM address space.

Referring back to FIG. 3, at any moment in time, DTU 300 may translate or map any a BA to a DA. This translation may be shown graphically. For example, FIG. 5 depicts a diagram 500 of mappings 506, 508, 512 and 514 from a bus address space 502 to a DRAM address space 504 for a computing system, such as computing systems 100 or 200 respectively depicted in FIGS. 1 and 2. Bus address space 502 is depicted in FIG. 5 as having an exemplary range of 0-1 terabyte, with an address size of 40-bit. Entry 510 is shown as being crossed out as an invalid entry as its associated bus address page is not mapped to any DRAM page.

The BA range and the DA range may be divided into pages or translation units of any size (e.g., 1 MB, 2 MB) suitable for the associated computing system and its functionality. In example embodiments, the BA range is divided into 2 MB translation units called super pages, which may herein be referred to as simply "pages" or abbreviated as bp.

Referring back to FIG. 3, DTU 300 may begin the translation process with the receipt of a bus address, such as bus address 114 shown in FIG. 1. From the bus address, a bus page bp may be determined using equation 1 below.

$$BA = DRAM\_base + bp*2\ MB + offset \qquad \text{Equation 1}$$

The terms of equation 1 are explained as follows.

DRAM_base is a value used by the on-chip processor cores to route a transaction to the appropriate MEMC, and it does not influence the DTU operation. The alignment of DRAM_base and the exposed address range (or a multiple thereof) has at least 1 GB granularity, rendering subtraction easy. Not all DRAM bases have to be naturally aligned to a multiple of the exposed address range.

"bp" represents a bus address super page index in the BA range. With super pages of 2 MB in size, there are 4096 super pages in an 8 GB range that can be represented in 12 bits. In other words, the number of bus address super pages in an 8 GB range may be represented as Nb=4096.

"offset" is a page offset. This field is used for addressing inside the super pages and is not used by the DTU itself. With 2 MB super pages, this is the lowest 21 bits of address. After subtracting the DRAM_base, the alignment of super pages is guaranteed to more than 2 MB. Therefore, the separating of bp and offset is merely bit selection.

The above are merely examples relating to a computing system that utilizes a super page having a size of 2 MB and a particular DRAM technology. As the DRAM technology and the page size changes (e.g., the page size may be smaller or larger than 2 MB), the above calculations would change accordingly. If the size of the super page changes, the end-bit location changes. For example, for an oversubscription factor of 3× and for a BA range of 12 GB, $N_b$=6144. As another example, a computing system with DA range=4 GB has $N_d$=2048 that may be encoded with 12 bits.

In a computing system where $N_b$=$N_d$ there is exactly one bus address for each byte in the DRAM device, the mapping between the BA space and the DA space is the identity function. It is desirable to have a computing system in which $N_b$>$N_d$, but at any given time no more than $N_d$ of the bus addresses are expected to be in use.

Figure 6:
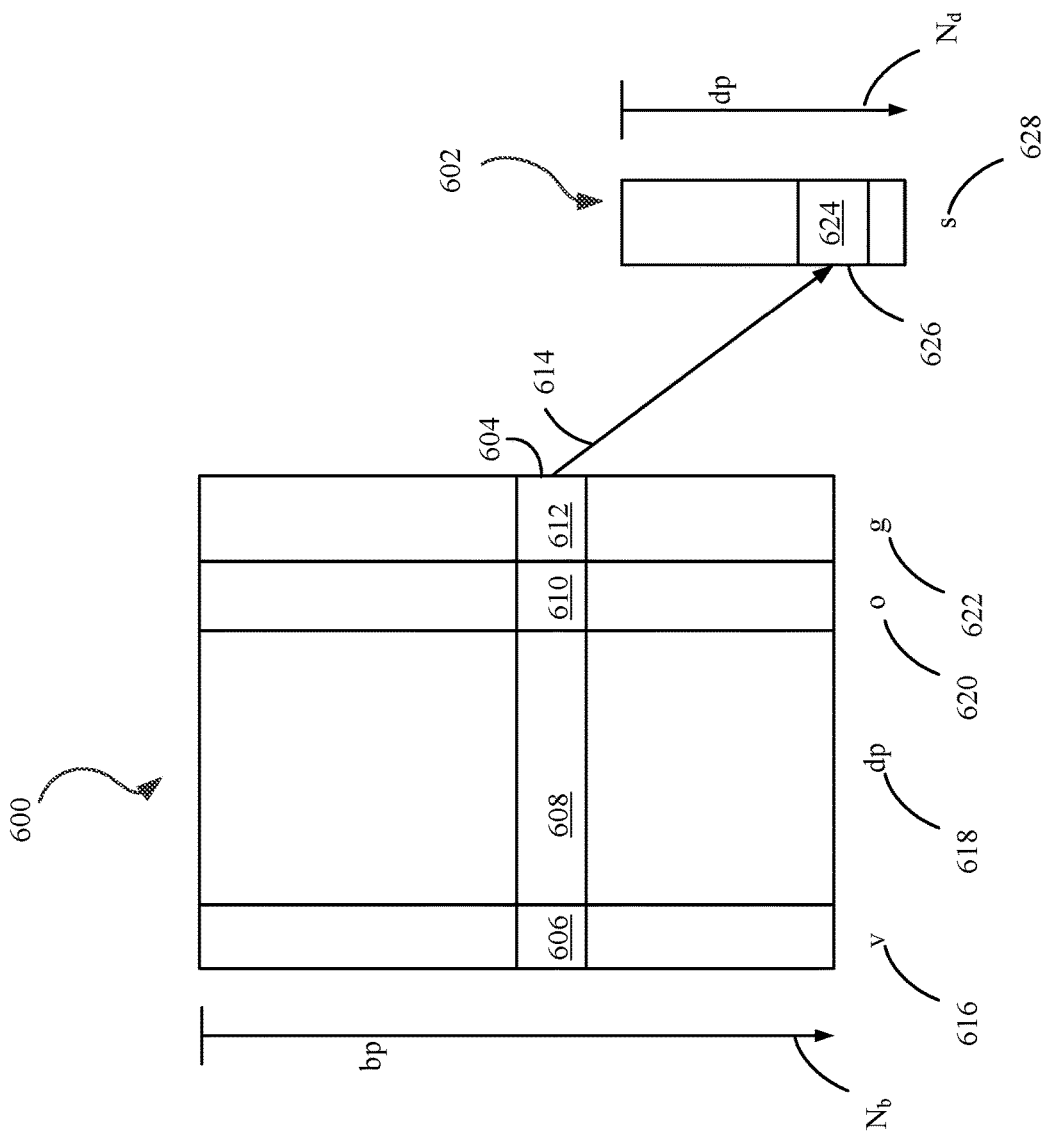
FIG. 6 shows a bus map and a device state array, according to an example embodiment.

FIG. 6 shows a bus map 600 and a device state array 602, according to an example embodiment. Bus map 600 and device state array 602 may be components of a DRAM translation unit, such as DTU 300 of FIG. 3. For example, DTU 300 may perform the translation of a bus address using bus map 302 and device state array 304, which may be implemented as bus map 600 and device state array 602, respectively. Bus map 600 is an array with $N_b$ entries, each of which is a bus address super page, bp, and $N_b$ is an equivalent number of super pages covering a BA range. Bus map 600 may be indexed by page index bp in the BA range. For a translation unit or bus page of 2 MB, bp may be any number from 0 up to but not including 4096, which may be represented as bp∈[0, $N_b$). Thus, each row in bus map 600 represents a bus page entry, for example entry 604. Each column of bus map 600 is a field that describes the associated bus page in some manner, for example, validity, corresponding device page, ownership or owner identity. As shown in FIG. 6, field 616 comprises a valid flag v indicating validity. For example, field 616 may be set to 1 if the associated bp is mapped to a dp and may be set to 0 if the associated bp is not mapped (e.g., v=1 or v=0). Field 618 comprises a dp flag that indicates a device address super page in the DA range to which the associated bp is mapped. Field 620 comprises an ownership flag o that indicates whether the associated bp is owned or not. For example, if the bp is owned by a component, this ownership field may be set to 1 otherwise it may be set to 0 (e.g., o=1 or v=0). Field 622 indicates the identity g of the owner of the associated bp. For example, the identity of the owner for a particular bp may be a series of number and/or characters or some other identifier.

In operation, DTU 300 may translate a bus address using equation 1 above by subtracting the DRAM_base and discarding the offset to obtain bp. Once bp is determined, it may be mapped to a dp and marked valid. Such mapping may be determined as follows.

$$Bus\_map[bp] = [v=1|dp] \qquad \text{Equation 2}$$

DTU 300 has a property such that no two bus addresses point to the same device address. For security reasons, this property guarantees that accesses to a particular device location may be controlled by controlling the bus address pointing to it and the mapping itself. Thus, isolation between subsystems may be enforced. A benefit of this property is that BA pointers may be shared between subsystems without the need to translate between address spaces (as is the case when two user-space processes want to share a page on top of an OS). A bus map storing bp→{v|dp} describes, but does not enforce this property. A device state array remedies this issue.

Device state array 602 has $N_d$ entries, each of which is a device address super page dp and $N_d$ is an equivalent number of super pages covering the DA range that corresponds to an installed DRAM capacity in the associated computing system of DTU 300. Thus dp∈[0, $N_d$), with $N_b$ being equal to or larger than $N_d$. Each entry of device state array holds a state 628 indicating the state of the corresponding device page as active (in use or mapped to a bp) or some other state. Before attempting to install a bus page mapping, it is necessary to check that Device_state[dp] is not active, meaning that the DRAM page is not assigned to another bus page. Then, to enforce the invariant property above regarding the unique mapping of a BA to a DA, DTU 300 may atomically populate both bus map 600 and device state array 602 as follows: Bus_map[bp]={v=1|dp} and Device_state[dp]={s=Active}. It is important that these two actions (which may be implemented by hardware in example embodiments) are inseparable, occurring contemporaneously or at substantially the same time, to prevent translation inconsistencies.

For example, bus map 600 may include an entry 604 that corresponds to a particular bus page. Entry 604 is a tuple that includes fields 606, 608, 610 and 612. Once the bus page of entry 604 is mapped to device state array 602 by mapping 614, field 606 may indicate the mapping with a valid flag (v=1), field 608 may include a device page, represented by entry 626 of device state array 602, to which the particular bus page is mapped, field 610 may indicate ownership with a valid o flag (o=1), and field 612 may indicate an owner ID. A state 624 of the device page corresponding to entry 626 is also set to active. Thus, mapping 614 effects changes to bus map 600 and device state array 602 at the same time or at substantially the same time. State 624 remains active (e.g., s=1) until the mapping is removed or the particular bus page is unmapped from the device page of entry 626.

The mapping manipulations between the BA space and the DA space may be performed with the following commands, for example, by allocator 306 shown in FIG. 3.

"dtu_map (bp, dp)": this command causes an attempt to install a mapping from a bus page bp to a device page dp that is supplied by the caller of the command. This operation will fail if bp is already in use.

"dtu_unmap (bp)": this command releases the underlying dp that bp points to and marks bp as inactive. This operation will fail if bp was not already active. Removing the mapping does not affect the content of the page pointed to by dp.

Mapping manipulations may be checked for success, for example, in the following sequence by allocator 306 shown in FIG. 3.

(a) Check that the intended bus page bp is not yet mapped, and the intended device page dp is inactive.

(b) Attempt the dtu_map (bp, dp) call.

(c) Check that the recorded mapping is correct. If not, it may be that, in the time between steps (a) and (b) above, another agent has installed a mapping on the page, and another attempt may be needed.

In example embodiments, when a domain needs a mapping for a particular bus page, a centralized agent may manage the availability of pages and broker requests from subsystems. For example, referring back to FIG. 3, allocator 306 may identify unmapped device address super pages that are available for mapping. For example, allocator 306 may poll device state array 304 for a free count that indicates a number of device address super pages having an inactive state that are available for mapping. Allocator 306 may be further configured to map one or more bus address super pages to the one or more device address super pages with dtu_map (bp, dp), and to unmap one or more bus address super pages from the one or more device address super pages with dtu_unmap (bp).

It is desirable for allocator 306 to expose the state of DTU 300 to monitor performance with the following observables.

Mapped count. This is the number m of bus pages that have a valid mapping (and v flag is set). This is always the same as the number of device pages in active state.

Free count. This is the number f of device pages that are in the inactive/free state, and are thus immediately available for mapping.

Pending count. This is the number p of device pages that are in the scrubbing state.

Returning to FIG. 6, the fields of each entry of bus map 600 may be made available as a read-back vector at the same address as the writable-command entry. Thus, dtu_map (bp, v=1) may be used in an attempt to acquire a mapping for the bp address, and read back to check status. For example, v=0 may be an indication that the acquire action failed. An application error may occur if the acquire action fails multiple times. Similarly, for each device state array 602 entry, the state may be read back.

In considering the above observables, m, f, p≤min($N_b$, $N_d$) and m+f+p=$N_d$. Because pages may migrate state between reads of the three m, f, p components, this equality may not always be observable. In addition, these observables, as well as the commands to manipulate bus map 600 and device state array 602 may be compacted into one 32-bit word, to allow a caller to atomically communicate all intents in one command.

In an example embodiment, allocator 306 may be implemented as a software component that identifies unmapped DA super pages that are available for mapping, as well as obtains and negotiates access to an unused or free device page.

In another example embodiment, the function of identifying, negotiating and obtaining unmapped DA super pages that are available for mapping may be implemented by a hardware component. In this embodiment, allocator 306 may be implemented with circuitry and/or other hardware rather than software. For example, allocator 306 may identify unmapped device address super pages that are available for mapping. Furthermore, allocator 306 may map one or more bus address super pages to the one or more device address super pages with dtu_map (bp, dp), and unmap one or more bus address super pages from the one or more device address super pages with dtu_unmap (bp), all in hardware. In this example, allocator 306 may be further configured to enforce mappings between bus address super pages and device address super pages. For example, allocator 306 may atomically populate bus map 302 and device state array 304 at the same time to prevent translation inconsistencies.

In a further example embodiment, allocator 306 may be implemented as a combination of hardware and software. For example, allocator 306 may implement the functions of identifying, negotiating, and obtaining device address super pages using software logic and commands while the function of mapping enforcement may be implemented using hardware.

Once a component acquires a bus page and a mapping to a device page is installed for it, only that component should be able to control when the device page is released. This mechanism is implemented with two columns in the bus map. Referring back to FIG. 6, field 620 indicates whether associated bp is owned with the ownership flag o, and field 622 indicates the identity g of the owner. Thus, the ownership flag o functions to indicate whether field 622 is valid. The width of field 622 may be dependent on the ID or identifier of the owner.

To manipulate fields 620 and 622, the following commands may be used, for example, by allocator 306 of FIG. 3:

dtu_set_owner (bp). This command will cause an attempt to assign ownership of the mapping to the requestor. This command will fail if bp is not mapped to a device page or if ownership is already set to a different owner or master. When a device page is indicated as "owned" command dtu_unmap will fail regardless of the caller.

dtu_unset_owner (bp). This command will cause an attempt to release ownership of the mapping. This command will fail if bp is not mapped or if the requestor is not the owner of this mapping. In operation, when this command is called, the DTU (e.g., DTU 300) may check that the ID of the caller matches what is stored in field 622 of bus map 600. Only when there is a match does the DTU proceed with the request to unset the owner. Removing ownership of bp-dp mapping does not affect the content of the device page pointed to by dp. In other words, ownership of a device page does not include access control of the data pointed to by the mapping.

When all of the fields of bus map 600 are considered, a bus map entry such as entry 604 may be represented as Bus_map[bp]={v|dp|o|g}.

Ownership manipulations may be checked for success, for example, by allocator 306 shown in FIG. 3 in the following sequence.

(a) Check that the intended bus page bp is mapped and not yet owned by another agent.

(b) Attempt the dtu_set_owner (bp) call.

(c) Check that the recorded owner is correct. If not, it may be that, in the time between steps (a) and (b) above, another agent has claimed ownership of the page.

When a component is done using a bus page and it is ready to remove ownership claims on it, there may be a need to remove any secret content in the pointed-to device page. This removal of content may be referred to as "scrubbing" and may be performed by a DRAM client, which may perform the scrubbing function by filling a device page with zeros to avoid a potential leak of secret content as the device page is being manipulated with mapping or ownership changes, for example.

For example, referring back to FIG. 3, scrub background agent 308 and scrubber 310 are components of DTU 300 that are responsible for the scrubbing operation of device pages. Scrub background agent 308 continuously monitors entries in device state array 304 to look for entries that are in need of scrubbing, by performing a continuously-running loop, for example. Every entry in device state array 304 may include another state in addition to "active," a "scrubbing" state. The scrubbing state indicates that a scrub action is needed or is in progress on the associated device page. Scrub background agent 308 may look for all the device pages having this state, Device_state [dp]={s=Scrubbing}. Any entry encountered having the scrubbing state will be queued to scrubber 310. Scrub background agent 308 may have lower access priority to the device state entries than other elements, such as DRAM access and page mapping. For example, a write transaction must be completed before a subsequent transaction, such as a command from scrub background agent 308.

Scrubber 310 is configured to receive the queue from scrub background agent 308. For example, scrubber 310 may receive dp as a device page address to clear. Scrubber 310 may clear or scrub dp by issuing a device write with a zero value. Scrubber 310 is further configured to change the state of the scrubbed device page back to active.

The scrub action may be performed using the following command, for example, by scrubber 310 shown in FIG. 3.

dtu_scrub (bp). This command marks the page pointed to by bp for scrubbing. The command fails if the page is not mapped or if it is owned but the requestor does not match the recorded owner.

When there are no entries in the scrubbing state, scrub background agent 308 may pause and resume again when a page state transition occurs. In an example embodiment, scrub background agent 308 may determine which page had been commanded with dtu_scrub, may wake up and schedule that particular page immediately for a scrub action. This scheme may reduce wait time if a subsystem is waiting for exactly that particular page to become available in the computing system. The subsystem waiting for the scrub action to be completed may poll for Device_state[dp]={s=Active} before initiating the next operation on this particular page. This scheme also places scrub background agent 308 back into pause the soonest.

In another example embodiment, the search for entries that need to be scrubbed may be performed concurrently with the scrub action. For example, there may be a queue of scrub items, and while one entry is being scrubbed by scrubber 310, scrub background agent 308 may be looking for the next entry that needs to be scrubbed, thereby overlapping the scrub and the search. This scheme may reduce wait time by a few cycles. For example, assuming that the search is one entry per cycle, $N_d$ cycles wait time may be the worst case scenario. Assuming the computing system is otherwise idle, and a theoretical bandwidth of 8 GB/s of a DDR3-2133 channel, scrubbing a 4 GB channel installation may consume 0.5 seconds or more. Thus, in an example embodiment, the scrub action may be done in parallel for multiple DRAM channels in a computing system instead of in series to save time.

While a scrub is pending for a device page or the device page is in process of being scrubbed, data access to the device page are considered errors and flagged as such (e.g., a zero is returned for read requests, write requests are dropped, and transaction captured). Accesses to that device page are re-enabled when the scrub action is completed. In an example embodiment, there is only one state in which scrubbing is a valid action, and that is the active state.

FIG. 7 shows a state diagram 700 of a life cycle of a device page in a device state array, for example, device state array 304 shown in FIG. 3, according to an example embodiment. State diagram 700 includes an inactive state 702, an active state 704, and a pending state 706. Initially, a device page starts in inactive state 702. When in inactive state 702, nothing points to device page, it does not have a bus address, and no bus transaction can reach its content. Once a mapping is installed with the dtu_map command, the device page is placed into active state 704. In active state 704, the content of the device page may be accessed. From active state 704, the device page may temporarily be placed into scrubbing state, indicated as pending state 706, with the dtu_scrub command, during which the device page waits for or is in the middle of a scrub action. From pending state 706, the device page may be returned to active state 704 after the scrubbing. From active state 704, the device page may be returned to inactive state 702 with the dtu_unmap command. In an example embodiment, bus addresses move instantaneously from valid to invalid at the moment their mapping links to respective device pages are severed.

In an example embodiment, the device page may include another state, modified (not showed in FIG. 7). In this embodiment, the memory controller may move the device page from an active state to a modified state at the first write to DRAM in that page. If, at the time of release, the page is still in active state, then the content is the same as what was left behind by the scrubber, and re-scrubbing simply wastes time and bandwidth. Alternatively, another flag may be added in lieu of adding the modified state.

FIG. 8 shows a state diagram 800 of a life cycle of a bus page of a bus map, such as bus map 302 shown in FIG. 3, according to an example embodiment. State diagram 800 includes an unmapped state 802, a mapped state 804, and an owned state 806. Initially, a bus page starts in unmapped state 802. Once a mapping is installed for the bus page to link it to a device page using the dtu_map command, the bus page is moved into mapped state 804. From mapped state 804, the bus page may be placed into owned state 806, with the dtu_set_owner command. From owned state 806, the bus page may be returned to mapped state 804 with the dtu_unset_owner command. From mapped state 804, the bus page may be returned to unmapped state 802 with the dtu_unmap command. In an example embodiment, there may be no mechanism implemented in hardware to ensure that a device page is scrubbed before dtu_unset_owner is called. Thus, when this command is called in combination with other system events, this command may allow some secret content to become visible to other agents in the computing system. In this case, a software implementation may be used to ensure that a scrub action occurs before the ownership is revoked. Alternatively, the DTU may be implemented in a manner that does not prevent a mapped page from being scrubbed. A scrub action may therefore be implemented before the unmapping of that device page.

Figure 9:
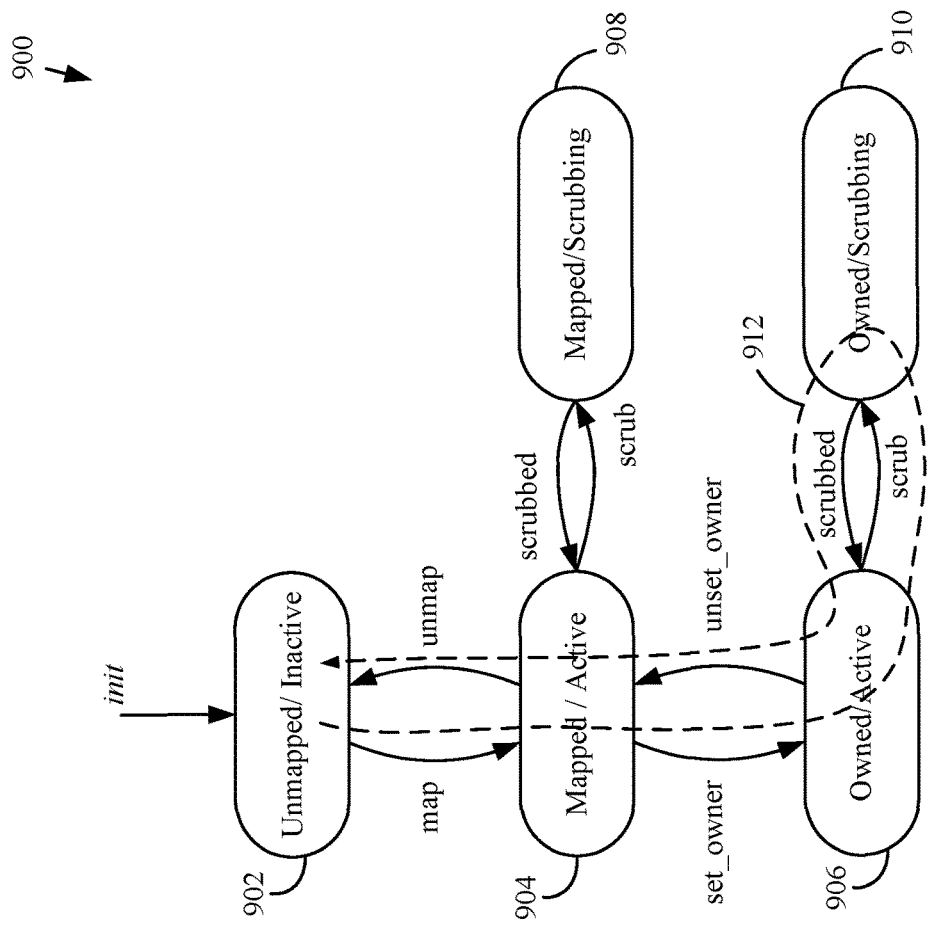
FIG. 9 shows a combination state diagram of a bus page and a device page, according to an example embodiment.

FIG. 9 shows a combination state diagram 900 of a bus page and a device page, according to an example embodiment. As an example, the bus page shown in state diagram 900 may be a bus page of bus map 302 and the device page referred to in state diagram 900 may be a device page of device state array 304 as shown in FIG. 3. State diagram 900 may be a combination of state diagram 700 and state diagram 800 respectively shown in FIGS. 7 and 8. State diagram 700 includes states 902, 904, 906, 908, and 910. These states correspond to the states shown in state diagrams 700 and 700 and have the same transitions therebetween. Each of these states will be described as a combination of a bus page state and a device page state. In state 702, the bus page is in an unmapped state and the device page is in an inactive state. The dtu_map command brings the bus page into a mapped state and the device page into an active state, shown as state 904. From state 904, a scrub operation places the device state into scrubbing/pending state while the bus page remains in the mapped state, and this combination is shown as state 908. Once the device page is scrubbed, it may be placed back in active state while the bus page state remains unchanged, as shown as state 904. To get from state 904 to state 906, the command set_owner may be used. In state 906, the bus map state is owned and the device state is active. From state 906, a scrub operation may place the device state into scrubbing/pending state while the bus page remains in the owned state, and this combination is shown as state 910 in state diagram 900. Once scrubbed, the device page may be returned to an active state and the bus map remains in the owned state, as shown in state 906. At this point, the unset_owner command places the bus page back into the mapped state and the device page back into the active state, shown as state 904 in FIG. 9. From state 904, the bus page and the device page may be returned to state 902 directly with the dtu_unmap command or the device page may be scrubbed again to get to state 908.

In an example embodiment, an intended life time of a bus page is shown by loop arrow 912 that starts in state 902 and proceeds through states 904, 906, and 910, then back to state 904 and state 902. In this embodiment, the obtaining and negotiating of access to an unused or free device page, if available, may be implemented by a software component, for example, allocator 306 shown in FIG. 3. Once a device page is identified as being available, the DRAM client may attempt to map it and lock ownership to that device page. The functions of identifying, negotiating and obtaining unmapped DA super pages that are available for mapping may be implemented by either a software or hardware component such as allocator 306 of FIG. 3. Once a device page is identified as being available, the DRAM client may attempt to map it and lock ownership to that device page. The enforcement of ownership may be implemented using hardware circuitry.

Figure 10:
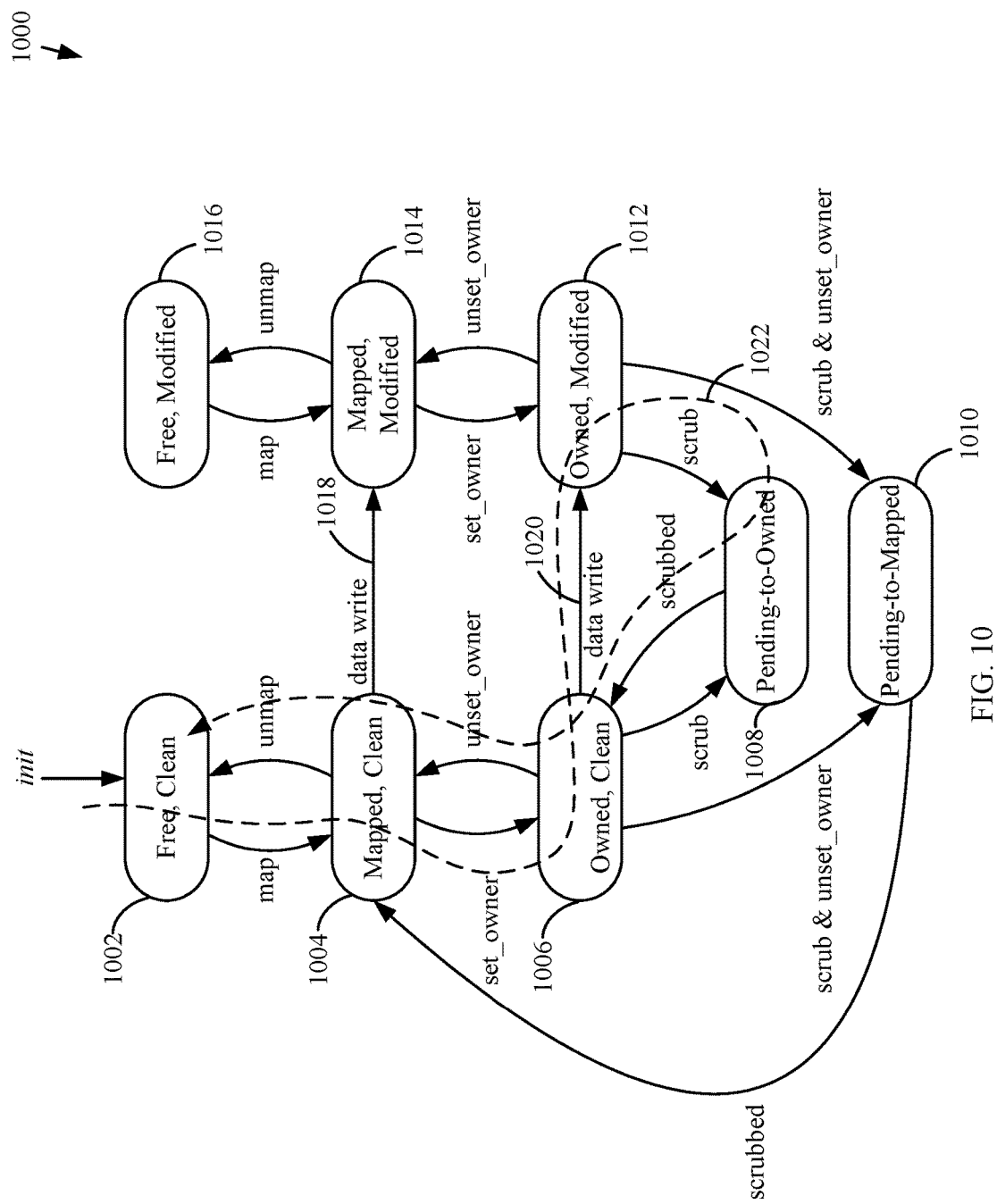
FIG. 10 shows another combination state diagram, according to an example embodiment.

FIG. 10 shows an alternative combination state diagram 1000, according to an example embodiment. State diagram 1000 is similar to state diagram 900 in that they both show the states of a bus page and a device page, which may be implemented as a bus page of bus map 302 and a device page of device state array 304 as shown in FIG. 3, for example. However, state diagram 1000 is different from state diagram 900 in that state diagram 1000 includes a free page finder component and a modified state for the device page, which enables the DTU translation process to be performed entirely in hardware. Therefore, this embodiment, without software use, may increase overall system robustness and trust at the cost of extra hardware over that of the embodiment shown in FIG. 9. In this embodiment, available free pages may be proactively identified and are immediately ready when requested, thereby reducing search time.

State diagram 1000 includes states 1002, 1004, 1006, 1008, 1010, 1012, 1014, and 1016, each of which is a combination of a bus page state and a device page state. The associated bus page states and device page states are denoted for each state of state diagram 1000 as follows—[bp state, dp state]—1002 [free, clean], 1004 [mapped, clean], 1006 [owned, clean], 1008 [pending-to-owned, --], 1010 [pending-to-mapped, --], 1012 [owned, modified], 1014[mapped, modified], and 1016 [free, modified]. A device page is modified if data has been written to it, for example, as a result of data writes 1018 or 1020. Calling a bus page manipulation command (e.g., dtu_map, dtu_set_owner, dtu_scrub, dtu_unmap) or a write command would cause a change of state of either the bus page, the device page, or both. For example, in reference to FIG. 3, a dtu_map command from allocator 306 may cause a change from state 1002 [free, clean] to state 1004 [mapped, clean]. This is because the dtu_map command maps the bp to the dp, thereby changing the state of the bus page, but the device page would remain clean because no data has been written to it.

In this embodiment, the intended lifetime of the bus page is denoted by a loop arrow 1022 that starts with state 1002 [free, clean], then proceeds to states 1004[mapped, clean],

1006 [owned, clean], 1008 [pending-to-owned, --], 1012 [owned, modified] and back through states 1006 [owned, clean], 1004 [mapped, clean] and 1002 [free, clean].

Figure 11:
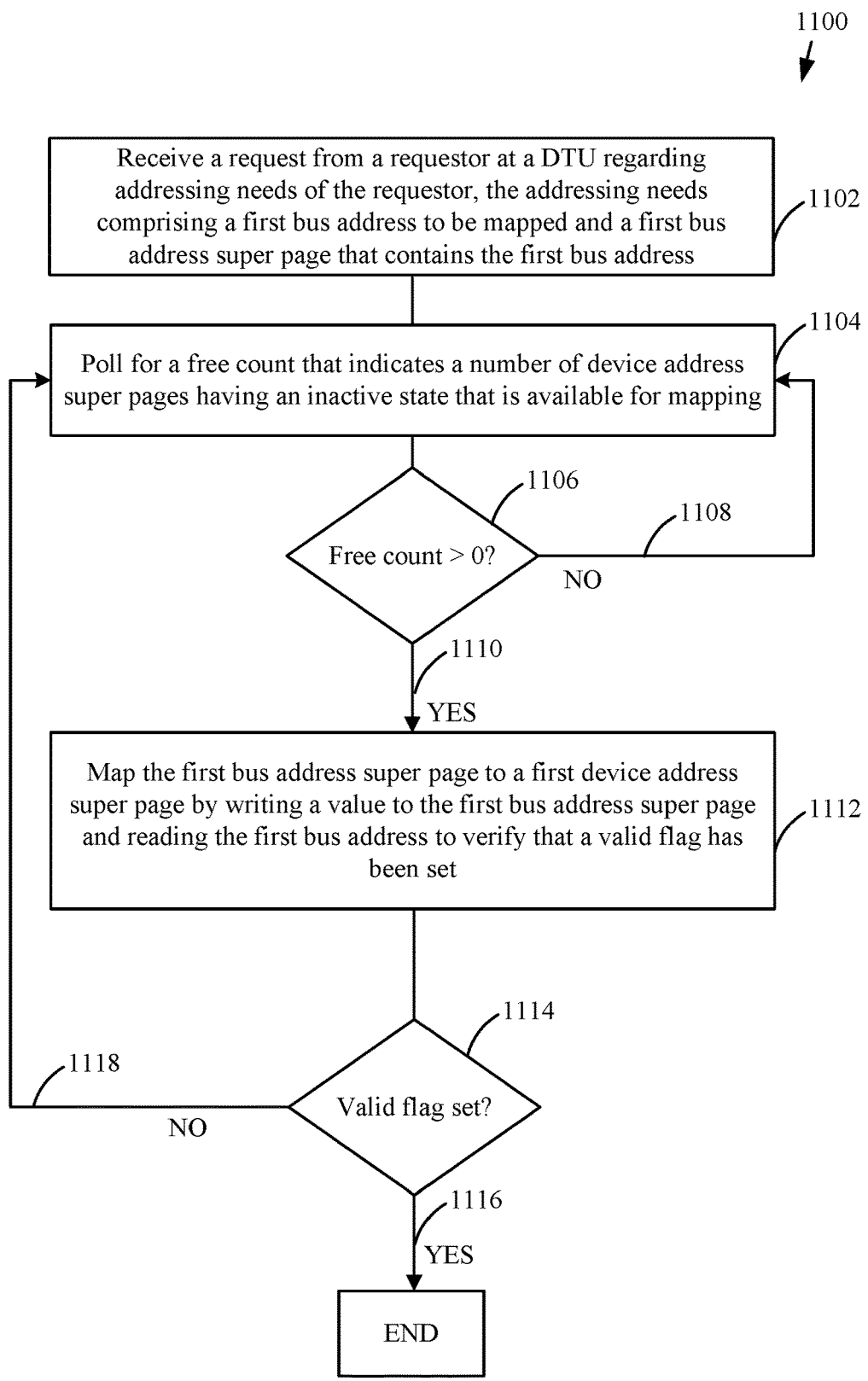
FIG. 11 is a flowchart providing a process for mapping a bus address, according to an example embodiment.
Figure 12:
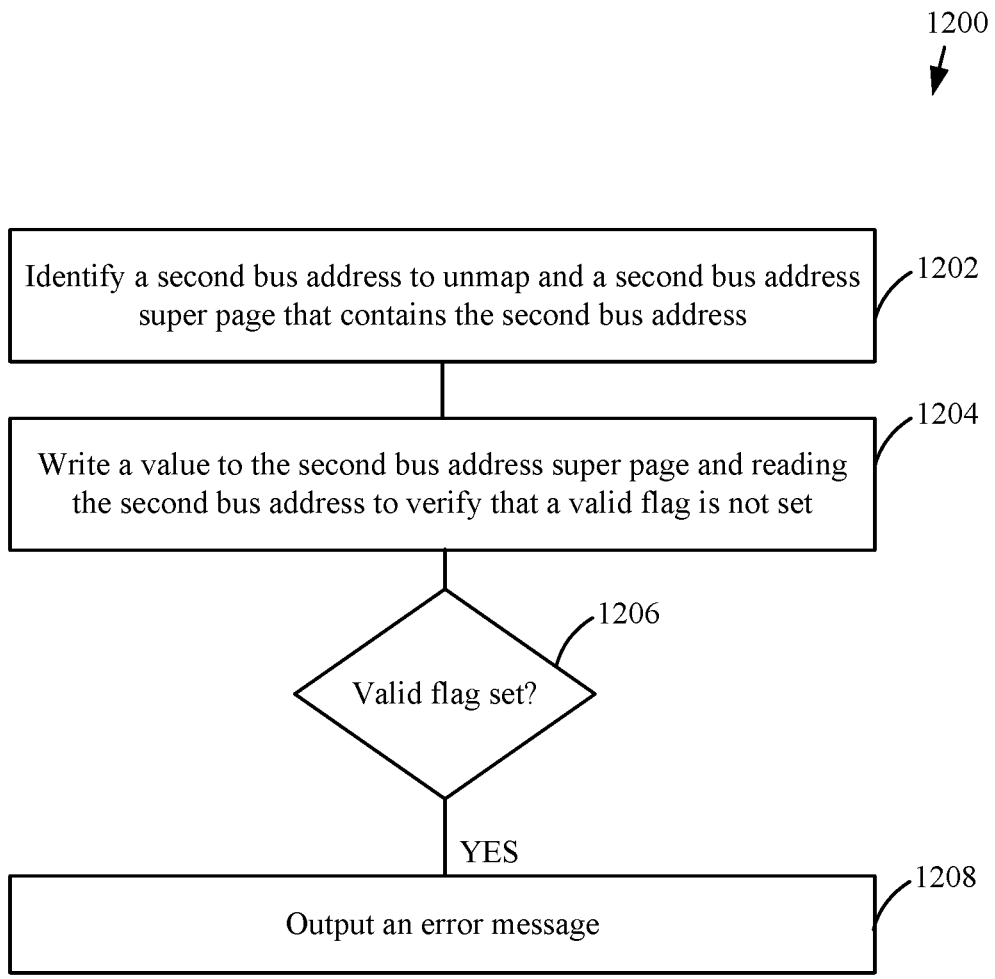
FIG. 12 is a flowchart providing a process for unmapping a bus address, according to an example embodiment.
Figure 13:
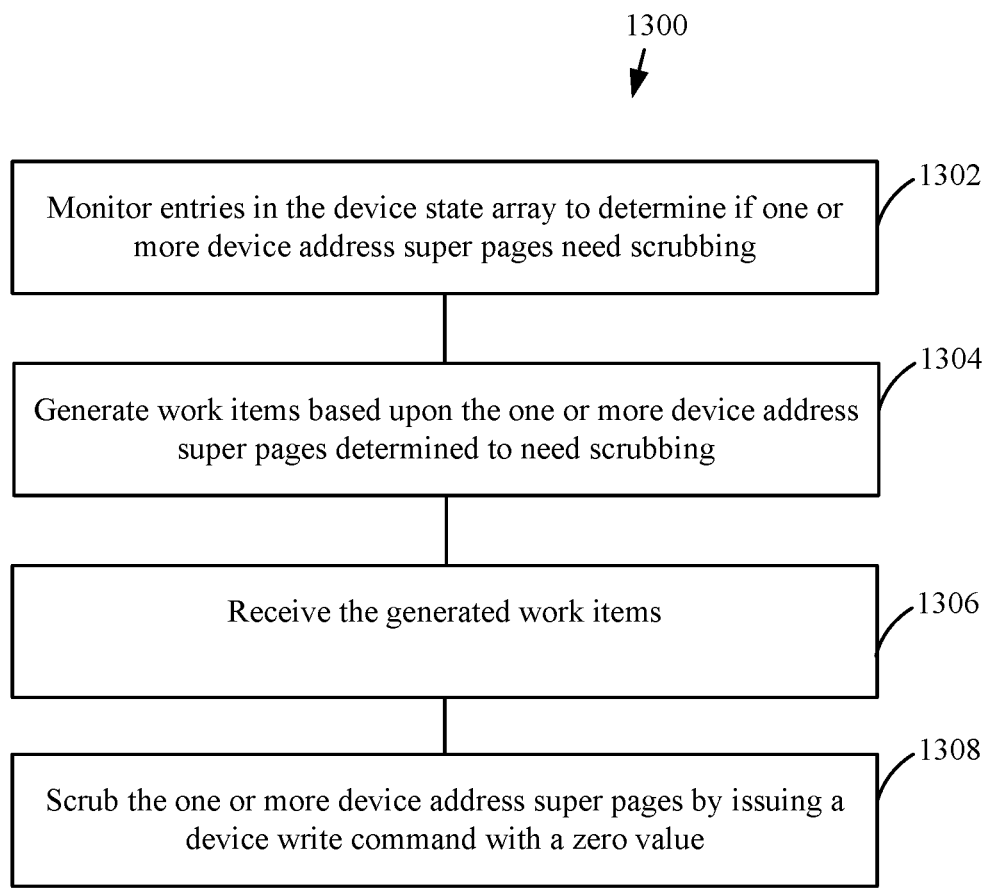
FIG. 13 is a flowchart providing a process for scrubbing a device page, according to an example embodiment.

Referring back to FIG. 3, DTU 300 may be implemented in hardware, in software executed by a suitable processing unit, or as a combination of hardware and software. To further illustrate the translation process, FIGS. 11-13 are flowcharts for mapping a bus address, unmapping a bus address, and scrubbing a device page, according to respective example embodiments. The methods of these flowcharts will be described in continued reference to DTU 300 and/or the associated computing system for illustrative purposes. However, these methods are not so limited. Further structural and operational embodiments will be apparent to persons skilled in the relevant art(s) based on the following descriptions of the flowcharts.

FIG. 11 shows a flowchart 1100 that provides a process for mapping a bus address, according to an example embodiment. Flowchart 1100 begins at step 1102, a request from a requestor at a DTU regarding address needs of the requestor is received, the addressing needs comprising a first bus address to be mapped and a first bus address super page that contains the first bus address. For example, in the embodiment shown in FIG. 1, this step may be performed when DRAM client 102 sends bus address 114 to DTU 110 via MEMC 106.

At step 1104, a free count is polled that indicates a number of device address super pages having an inactive state that is available for mapping. For example, in the embodiment shown in FIG. 3, this step may be performed by allocator 306 using bus map 302 and device state array 304.

Step 1106 is a decision step in which the free count is determined. If the free count is determined to be less than zero as indicated by arrow 1108, meaning no device address super page is available for mapping, then the process returns to step 1104. However, if the free count is determined to be greater than zero as indicated by arrow 1110, then the process proceeds to step 1112. For example, in the embodiment shown in FIG. 3, this step may be performed by allocator 306 using bus map 302 and device state array 304.

At step 1112, the first bus address super page is mapped to a first device address super page by writing a value (e.g., 1) to the first bus address super page and first bus address is read to verify that a valid flag has been set. This step may be performed by allocator 306 of FIG. 3, for example, using the dtu_map command.

Step 1114 is a decision step, in which the determination of whether the valid flag is set is made. If yes as indicated by arrow 1116, then the process ends because this means the mapping was successfully installed. If the valid flag is not set, as indicated by arrow 1118, then the process returns to step 1104. For example, in the embodiment shown in FIG. 3, this step may be performed by allocator 306 using bus map 302 and device state array 304.

FIG. 12 shows a flowchart 1200 that describes a method for unmapping a bus address in accordance with an example embodiment. Flowchart 1200 begins with step 1202, a second bus address to unmap and a second bus address super page that contains the second bus address are identified. In the example embodiment of FIG. 3, this step may be performed by allocator 306.

At step 1204, a value is written to the second bus address super page and the second bus address is read to verify that a valid flag is not set. For example, in the embodiment of FIG. 3, this step may be performed by allocator 306 by using the dtu_unmap command.

At step 1206, a determination is made whether the valid flag is set. For example, in the embodiment of FIG. 3, this step may be performed by allocator 306. If the valid flag is not set, this means that the unmapping was successful and that the second bus address is no longer mapped and the process may end here. However, if the valid flag is set (e.g., 1) indicating that the unmapping failed, then the process continues to step 1208. If the valid flag is not set (e.g., 0) indicating that the unmapping was successful, then the process may end.

At step 1208, an error message is indicated or output. For example, in the embodiment of FIG. 3, this step may be performed by allocator 306.

FIG. 13 shows a flowchart 1300 that describes a method for scrubbing a device page in accordance with an example embodiment. Flowchart 1300 begins with step 1302, entries in the device state array are monitored to determine if one or more device address super pages need scrubbing. In the example embodiment of FIG. 3, this step may be performed by scrub background agent 308.

At step 1304, work items are generated based upon the one or more device address super pages determined to need scrubbing. In the example embodiment of FIG. 3, this step may be performed by scrub background agent 308.

At step 1306, the generated work items are received. In the example embodiment of FIG. 3, this step may be performed by scrubber 310. For example, the work items may be received in the form of a queue from scrub background agent 308, where the work items are device address super pages that need clearing.

At step 1308, the one or more device address super pages are scrubbed by issuing a device write command with a zero value. In the example embodiment of FIG. 3, this step may be performed by scrubber 310. While a zero write command is disclosed, any other method for clearing content from a device address super page may be employed to prevent secret content from being leaked.

Example Computing System Implementation

Figure 14:
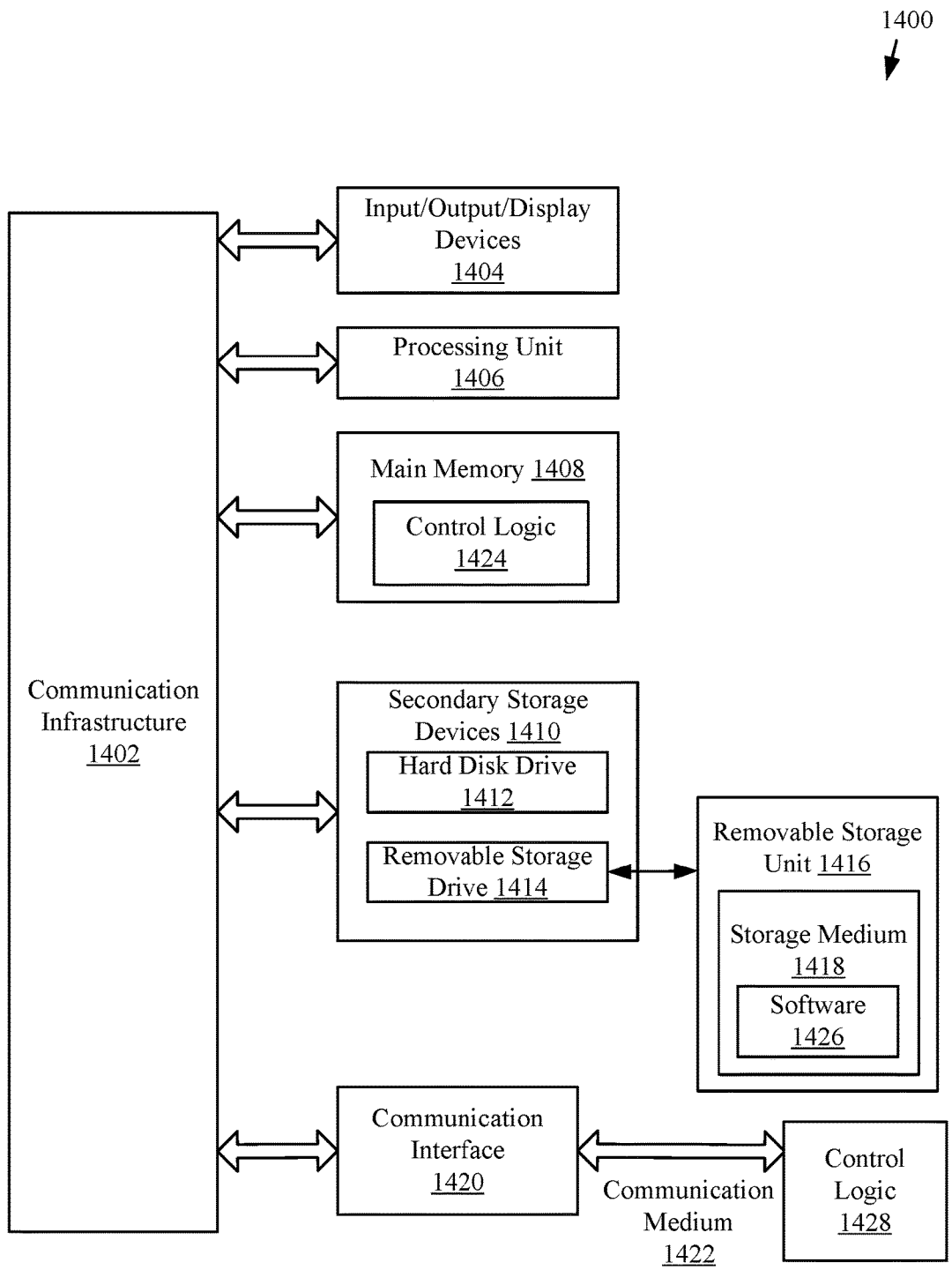
FIG. 14 is a block diagram of an example computing system that may be used to implement various embodiments.

The embodiments described herein, including systems, methods/processes, and/or apparatus, may be implemented using well known computing devices, such as computer 1400 shown in FIG. 14. For example, elements of DTU 300, including allocator 306, background agent 308, and scrubber 310; and each of the steps of flowchart 1100 depicted in FIG. 11; each of the steps of flowchart 1200 depicted in FIG. 12; and each of the steps of flowchart 1300 depicted in FIG. 13 can each be implemented using one or more computers 1400.

As shown in FIG. 14, computer 1400 includes a processing unit 1406. Processing unit 1406 may comprise one or more processors (also called central processing units or CPUs) or processor cores. Processing unit 1406 is connected to a communication infrastructure 1402, such as a communication bus. Computer 1400 also includes a primary or main memory 1408, such as random access memory (RAM). Main memory 1408 has stored therein control logic 1424 (computer software), and data.

Computer 1400 also includes one or more secondary storage devices 1410. Secondary storage devices 1410 include, for example, a hard disk drive 1412 and/or a removable storage device or drive 1414, as well as other types of storage devices, such as memory cards and memory sticks. For instance, computer 1400 may include an industry standard interface, such as a universal serial bus (USB) interface for interfacing with devices such as a memory stick. Removable storage drive 1414 represents a floppy disk drive, a magnetic tape drive, a compact disk drive, an optical storage device, tape backup, etc.

Removable storage drive 1414 interacts with a removable storage unit 1416. Removable storage unit 1416 includes a computer useable or readable storage medium 1418 having stored therein computer software 1426 (control logic) and/or data. Removable storage unit 1416 represents a floppy disk, magnetic tape, compact disc (CD), digital versatile disc (DVD), Blu-ray disc, optical storage disk, memory stick, memory card, or any other computer data storage device. Removable storage drive 1414 reads from and/or writes to removable storage unit 1416 in a well-known manner.

Computer 1400 also includes input/output/display devices 1404, such as monitors, keyboards, pointing devices, etc.

Computer 1400 further includes a communication or network interface 1420. Communication interface 1420 enables computer 2100 to communicate with remote devices. For example, communication interface 1420 allows computer 1400 to communicate over communication networks or mediums 1422 (representing a form of a computer useable or readable medium), such as local area networks (LANs), wide area networks (WANs), the Internet, etc. Network interface 1420 may interface with remote sites or networks via wired or wireless connections. Examples of communication interface 1422 include but are not limited to a modem (e.g., for 3G and/or 4G communication(s)), a network interface card (e.g., an Ethernet card for Wi-Fi and/or other protocols), a communication port, a Personal Computer Memory Card International Association (PCM-CIA) card, a wired or wireless USB port, etc.

Control logic 1428 may be transmitted to and from computer 1400 via the communication medium 1422.

Any apparatus or manufacture comprising a computer useable or readable medium having control logic (software) stored therein is referred to herein as a computer program product or program storage device. This includes, but is not limited to, computer 1400, main memory 1408, secondary storage devices 1410, and removable storage unit 1416. Such computer program products, having control logic stored therein, may be executed by processing unit 1406 to perform methods described herein. For example, such computer program products, when executed by processing unit 1406, may cause processing unit 1406 to perform any of the steps of flowchart 1100 of FIG. 11, flowchart 1200 of FIG. 12, and flowchart 1300 of FIG. 13.

The disclosed technologies may be embodied in software, hardware, and/or firmware implementations other than those described herein. Any software, hardware, and firmware implementations suitable for performing the functions described herein can be used.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising:
a dynamic random access memory (DRAM) translation unit (DTU) configured to map a bus address in a bus address super page to a device address in a device address super page, the DTU comprising:
a device state array comprising $N_d$ entries, each of which is a device address super page, and $N_d$ is an equivalent number of super pages covering a device address range that corresponds to an installed DRAM capacity; and
a bus map comprising $N_b$ entries, each of which is a bus address super page, and $N_b$ is an equivalent number of super pages covering a bus address range, $N_b$ being equal to or larger than $N_d$,
wherein the DTU is configured to map the bus address super page to the device address super page within a predetermined period of time to meet real-time requirements of DRAM requests having an upper-bound response time.

2. The system of claim 1, further comprising an integrated circuit chip that includes the device state array and the bus map.

3. The system of claim 1, wherein the DTU further comprises a scrub background agent configured to monitor the $N_d$ entries to determine if one or more device address super pages need scrubbing.

4. The system of claim 3, wherein the DTU further comprises a scrubber configured to scrub the one or more device address super pages determined to need scrubbing and to change a state of the scrubbed one or more device address super pages to active.

5. The system of claim 4, wherein the scrubber is configured to scrub the one or more device address super pages determined to need scrubbing by issuing a device write command with a zero value.

6. The system of claim 1, wherein the DTU further comprises an allocator configured to identify unmapped device address super pages that are available for mapping.

7. The system of claim 6, wherein the allocator is implemented in software and is further configured to map one or more bus address super pages to one or more device address super pages, and to unmap one or more bus address super pages from one or more device address super pages.

8. The system of claim 6, wherein the allocator is implemented in hardware.

9. The system of claim 6, wherein the allocator is further configured to enforce mappings between bus address super pages and device address super pages, and the allocator is implemented in hardware.

10. The system of claim 1, further comprising at least one memory controller.

11. The system of claim 1, wherein the device state array and the bus map are updated contemporaneously.

12. A method, comprising:
(a) receiving a request from a requestor at a dynamic random access memory (DRAM) translation unit (DTU) regarding addressing needs of the requestor, the addressing needs comprising a first bus address to be mapped and a first bus address super page that contains the first bus address;
(b) polling for a free count that indicates a number of device address super pages having an inactive state that is available for mapping;
(c) in response to determining that the free count is greater than zero, mapping the first bus address super page to a first device address super page by writing a value to the first bus address super page and reading the first bus address to verify that a valid flag has been set; and
(d) if no valid flag is set, repeating steps (b) and (c).

13. The method of claim 12, further comprising:
(e) identifying a second bus address to unmap and a second bus address super page that contains the second bus address;
(f) writing a value to the second bus address super page and reading the second bus address to verify that a valid flag is not set; and
(g) outputting an error message if the valid flag is set.

14. The method of claim 12, wherein the mapping of the first bus address super page to the first device address super page is performed within a fixed period of time to meet real-time requirements of DRAM requests having an upper-bound response time.

15. The method of claim 12, wherein the mapping of the first bus address super page to the first device address super page is performed using an on-chip device state array and a bus map.

16. The method of claim 15, further comprising:
monitoring entries in the device state array to determine if one or more device address super pages need scrubbing; and
generating work items based upon the one or more device address super pages determined to need scrubbing.

17. The method of claim 16, further comprising:
receiving the generated work items; and
scrubbing the one or more device address super pages by issuing a device write command with a zero value.

18. A dynamic random access memory (DRAM) translation unit (DTU) for mapping a bus address to a device address, comprising:

a device state array comprising a plurality of device page entries, each of which corresponds to a device page, the plurality of device page entries covering a device address range that corresponds to an installed DRAM capacity;

a bus map comprising a plurality of bus page entries, each of which corresponds to a bus page;

an allocator configured to manage availability of the device pages, wherein the allocator is further configured to map a first bus address super page to first device address super page by writing a value to the first bus address super page and, reading a first bus address in the first bus address super page to verify that a valid flag has been set;

a scrub background agent configured to monitor the plurality of device page entries to determine if one or more device pages need scrubbing; and a scrubber configured to scrub the one or more device pages determined to need scrubbing by issuing a device write command with a zero value.

19. The DTU of claim 18, wherein the number of bus page entries is equal to or greater than the number of device page entries.

20. The DTU of claim 18, wherein the device write command is configured to fill the one or more device pages determined to need scrubbing with zeros.

* * * * *

UNITED STATES PATENT AND TRADEMARK OFFICE
CERTIFICATE OF CORRECTION

PATENT NO. : 10,331,570 B2
APPLICATION NO. : 15/289742
DATED : June 25, 2019
INVENTOR(S) : Flaviu Dorin Turean It is certified that error appears in the above-identified patent and that said Letters Patent is hereby corrected as shown below:

In the Claims

Column 22, Line 12, please replace "address super page and, reading a first bus" with --address super page and reading a first bus--.

Signed and Sealed this
Twenty-second Day of October, 2019

Andrei Iancu
*Director of the United States Patent and Trademark Office*